(12) United States Patent
Zhou et al.

(10) Patent No.: US 11,984,837 B2
(45) Date of Patent: May 14, 2024

(54) METHOD FOR DETERMINING AN ANGULAR POSITION OF A ROTATING COMPONENT, IN PARTICULAR OF AN ELECTRIC MOTOR FOR A CLUTCH ACTUATION SYSTEM OF A VEHICLE

(71) Applicant: SCHAEFFLER TECHNOLOGIES AG & CO. KG, Herzogenaurach (DE)

(72) Inventors: Jie Zhou, Baden-Baden (DE); Wai-Wai Buchet, Strassburg (FR); Paul Walden, Freiburg im Breisgau (DE)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 1145 days.

(21) Appl. No.: 16/614,049

(22) PCT Filed: May 8, 2018

(86) PCT No.: PCT/DE2018/100432
§ 371 (c)(1),
(2) Date: Nov. 15, 2019

(87) PCT Pub. No.: WO2018/219388
PCT Pub. Date: Dec. 16, 2018

(65) Prior Publication Data
US 2021/0159822 A1     May 27, 2021

(30) Foreign Application Priority Data

May 31, 2017   (DE) .......................... 102017111895.0

(51) Int. Cl.
*H02P 6/16*        (2016.01)
*F16D 28/00*      (2006.01)
(Continued)

(52) U.S. Cl.
CPC ............... *H02P 6/16* (2013.01); *F16D 28/00* (2013.01); *G01B 7/30* (2013.01); *G01D 5/145* (2013.01);
(Continued)

(58) Field of Classification Search
CPC ........ H02P 6/16; F16D 28/00; F16D 2300/18; F16D 2500/1025; F16D 2500/3021;
(Continued)

(56) References Cited

U.S. PATENT DOCUMENTS

| | | | | |
|---|---|---|---|---|
| 2013/0218517 A1* | 8/2013 | Ausserlechner | ..... | G01D 5/2451 324/207.13 |
| 2014/0253106 A1* | 9/2014 | Granig | ................ | G01D 5/165 324/207.25 |

FOREIGN PATENT DOCUMENTS

| | | |
|---|---|---|
| CN | 103256883 A | 8/2013 |
| CN | 104769306 A | 7/2015 |

(Continued)

OTHER PUBLICATIONS

DE 102012202404 A1 "Angle of Rotation Sensor for Absolute Rotation Angle Determination Even With Multiple Revolutions" Date Published: Aug. 22, 2013 Ausserlechner (Year: 2013).*
(Continued)

*Primary Examiner* — Jorge L Carrasquillo

(57) ABSTRACT

A method for determining an angular position of a rotating component is disclosed. A sensor system is positioned at a radial distance from an axis of rotation of the rotating component. A magnetic ring is arranged fixedly and concentrically on the rotating component, generating a magnetic field that changes with respect to the sensor system. The sensor system detects the magnetic field in which a signal is captured and evaluated with respect to the angular position. Errors in the measurement of the angular position can be
(Continued)

corrected. The signal captured by the sensor system is evaluated with respect to the amplitude information of the magnetic field. A correction parameter is determined from the amplitude information, and an angle error is of the angular position is determined based on the correction parameter. The angle error is used to correct the angular position.

11 Claims, 4 Drawing Sheets

(51) Int. Cl.
    *G01B 7/30*       (2006.01)
    *G01D 5/14*       (2006.01)
    *G01D 5/244*     (2006.01)
    *H02K 7/06*       (2006.01)
    *H02K 29/08*     (2006.01)

(52) U.S. Cl.
    CPC ..... *G01D 5/24471* (2013.01); *G01D 5/24476* (2013.01); *H02K 29/08* (2013.01); *F16D 2300/18* (2013.01); *F16D 2500/1025* (2013.01); *F16D 2500/3021* (2013.01)

(58) Field of Classification Search
    CPC ...... G01B 7/30; G01D 5/145; G01D 5/24471; G01D 5/24476; H02K 29/08
    USPC .................................................... 318/400.38
    See application file for complete search history.

(56) References Cited

FOREIGN PATENT DOCUMENTS

| | | |
|---|---|---|
| CN | 105452815 A | 3/2016 |
| DE | 102006033525 A1 | 2/2007 |
| DE | 102010032061 A1 | 1/2012 |
| DE | 102012202404 A1 | 8/2013 |
| DE | 102013222366 A1 | 5/2014 |
| DE | 102016104285 A1 | 9/2016 |
| DE | 102015105854 A1 | 10/2016 |
| DE | 102016112670 A1 | 2/2017 |
| DE | 102016212175 A1 | 1/2018 |
| DE | 102016212925 A1 | 1/2018 |
| EP | 0986162 A1 | 3/2000 |
| WO | 2017036476 A1 | 3/2017 |

OTHER PUBLICATIONS

JP 2014142322 A "Rotation Angle Detection Device" Date Published:Aug. 7, 2014 Karizume (Year: 2014).*

JP H1080188 A "Control Method of Rotary Magnet Type Polyphase Synchronous Motor and Its Equipment" Date Published: Mar. 24, 1998 Kojima (Year: 1998).*

Arai et al. (JP 2007336707 A). "Motor Controller" Date Published Dec. 27, 2007 (Year: 2007).*

* cited by examiner

METHOD FOR DETERMINING AN ANGULAR POSITION OF A ROTATING COMPONENT, IN PARTICULAR OF AN ELECTRIC MOTOR FOR A CLUTCH ACTUATION SYSTEM OF A VEHICLE

CROSS-REFERENCE TO RELATED APPLICATIONS

This application is the U.S. National Phase of PCT/DE2018/100432 filed May 8, 2018, which claims priority to DE 10 2017 111 895.0 filed May 31, 2017, the entire disclosures of which are incorporated by reference herein.

TECHNICAL FIELD

The disclosure relates to a method for determining an angular position of a rotating component, in particular an electric motor for a clutch actuation system of a vehicle, in which the angular position of the rotating component is captured by a sensor that is radially spaced apart from the axis of rotation of the rotating component, wherein a magnetic ring that is fixed to and concentrically disposed on the rotating component builds up a magnetic field that changes relative to the sensor arrangement and that is detected by the sensor arrangement, wherein a signal obtained from the sensor arrangement is evaluated with respect to the angular position.

BACKGROUND

DE 10 2006 033 525 A1 discloses a method for determining an angular position of a rotating component.

DE 10 2010 032 061 A1 discloses a device for measuring a rotation angle and/or a torque.

DE 10 2015 105 854 A1 discloses a sensor arrangement for determining an angular position of a rotor relative to a stator.

EP 0 986 162 A1 discloses a sensor arrangement for determining the direction of a rotor magnetization and/or the axial position of the rotor.

DE 10 2012 202 404 A1 discloses a rotation angle sensor for absolute rotation angle determination and multiple revolutions.

From WO 2017/036476 A1, an angular measuring device for a rotary driven linear actuator is known, in which an off-axis design is used, i.e. the sensor arrangement is disposed parallel to and spaced apart from the central axis of the rotor of an electric motor. A magnetic ring that is disposed concentrically on the rotor forms a magnetic field that is monitored by the sensor arrangement and from which an angular position of the rotor is determined.

DE 10 2013 222 366 A1 discloses a method for determining a position of an electric motor in which the sensors are disposed outside the axis of rotation of the electric motor. The evaluation unit, which evaluates the sensor signals obtained at the sensor arrangement, is positioned spatially separated from the sensor arrangement.

In addition, it is known that a sinusoidal signal is calculated from the values output by the sensor arrangement and the direction of a magnetic field is determined using a null crossing of this sinusoidal signal. The angle information is then determined from the magnetic field components. However, in off-axis applications errors that can be more than 20° occur in determining the angular position. In addition, the dynamic tolerances that occur due to tumbling of the magnetic ring diametrically disposed on the rotor of the electric motor can be very large.

SUMMARY

It is therefore an object of the disclosure to specify a method for determining an angular position of an electric motor in which the error possibilities are substantially limited.

According to embodiments, the signal obtained from the sensor arrangement is evaluated with respect to amplitude information of the magnetic field, wherein from the amplitude information a correction parameter is determined, by which an angular error of the angular position obtained from the signal of the sensor arrangement is determined and the angular error is used to correct the angular position determined from the signal output by the sensor arrangement. The use of amplitude information is based on the recognition that the amplitudes of a magnetic field vector in different spatial directions are usually unequal in the event of errors occurring. Therefore, in a Lissajous figure an ellipse occurs, the main axis and minor axis of which correspond to the amplitudes of the magnetic field. Thus, a correction parameter can be easily determined from said amplitudes, by which a specific angular position of the rotating component can be determined. Due to such a simple mathematical method, changes in the shape of the magnets, which are very complex in design and costly, can be omitted, which enables a very cost-effective process.

In embodiments, for the determination of the correction parameter from the amplitude information, an amplitude of a tangential magnetic field direction and an amplitude of a radial magnetic field direction of a magnetic flux are determined, which give the correction parameter when set in relation to each other. The use of the tangential and radial magnetic field directions corresponds to an x-y expansion of the magnetic field, in which the magnetic ring, which is attached to the rotating component, expands and which is sampled by the sensor arrangement.

In one embodiment, the correction parameter is determined at the end of assembly of the sensor component unit. A correction parameter that is determined in this way can be used to determine the angular position at any time.

To correct static errors in determining the angular position, the correction parameter is used as a constant.

In one embodiment, the correction parameter is adapted during a process of measurement of the angular position of the rotating component, wherein in particular the correction parameter determined at the end of assembly is used as the initial correction parameter at the start of the measurement process. By adapting the correction parameter, dynamic errors such as tumbling of the magnetic ring are also corrected well.

In one variant, evaluation electronics contained in the sensor arrangement are used for evaluation of the signal obtained from the sensor arrangement regarding an amplitude of the magnetic field and the angular position of the rotating component. In this case, measures for the correct transmission of the signal output by the sensor arrangement to the evaluation electronics can be omitted.

In one development, the signal indicating the angular position of the rotating component, which is output by the evaluation electronics, is sampled at a high frequency. Thus, with rapidly rotating components, various items of angular information can be reliably determined, which are captured one after the other in short time intervals.

The signal output by the evaluation electronics characterizing the amplitude of the magnetic field may be sampled at a low frequency. Since the correction parameter is determined from the signal characterizing the amplitudes, this only has to be corrected at specified time intervals, which is sufficient for an accurate determination of the angular position.

In a further embodiment, the signal indicating the amplitude of the magnetic field that is output by the evaluation electronics is sampled at least twice per revolution of the rotating component. This evaluation method is sufficient to set a sufficiently accurate correction parameter to compensate for dynamic errors in determining the angular position of the rotating component.

BRIEF DESCRIPTION OF THE DRAWINGS

Various embodiments are described in more detail on the basis of the figures shown in the drawing.

In the figures.

DETAILED DESCRIPTION

Figure 1:
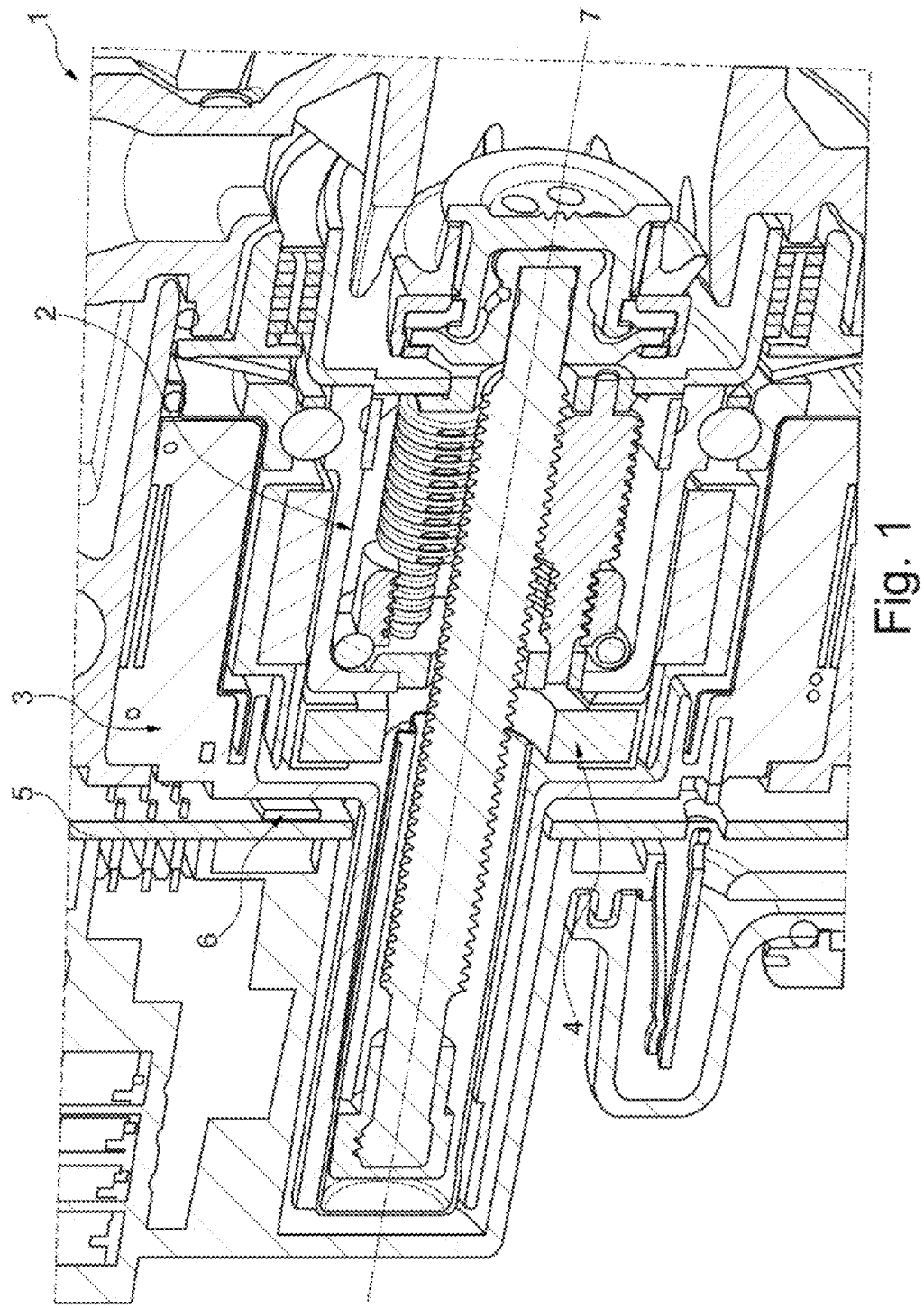
FIG. 1 shows an actuator with a sensor arrangement in a sectional side view.

In FIG. 1 an exemplary embodiment of an actuator 1 with a sensor arrangement is shown in a side view, in which the actuator 1 comprises an electric motor comprising a rotor 2 and a fixed stator 3 enclosing the rotor 2. A magnetic ring 4 with diametric magnetization is disposed on the end face of the rotor 2. The sensor arrangement 6 in the form of a measuring and evaluation unit is positioned on a board 5, wherein said sensor arrangement 6 is radially spaced apart from the axis of rotation 7 of the electric motor 2, 3.

Figure 2:
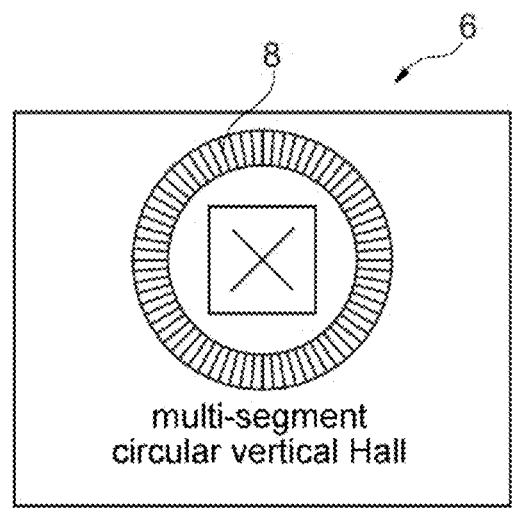
FIG. 2 shows a basic representation of a sensor arrangement containing an evaluation device.
Figure 3:
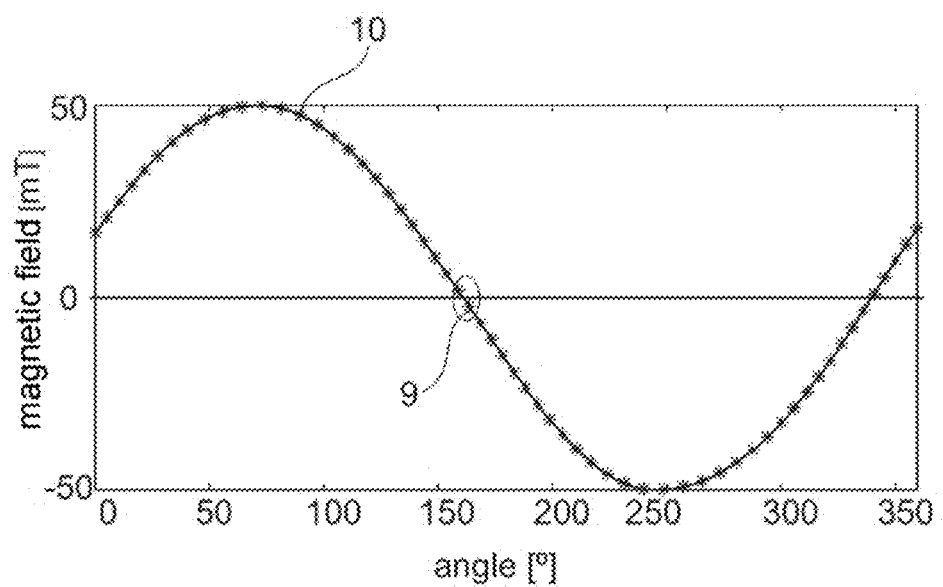
FIG. 3 shows a basic representation of a processing signal within the sensor arrangement.

The sensor arrangement 6 is reproduced in FIG. 2 in a basic representation. A number of Hall sensors 8 that are positioned circularly disposed about a central axis capture the magnetic field of the magnetic ring 4. The Hall sensors 8 output a sinusoidal output signal, as shown in FIG. 3. In FIG. 3 the magnetic field of the magnetic ring 4 is shown against the angle of the rotating magnetic field. Each point 10 of the sinusoidal signal reflects the information of each of the Hall sensors 8. Said Hall sensors 8 thus form a single-turn sensor for a measuring range of 360 degrees of angle.

In one measurement, all values output by the Hall sensors 8 are recorded simultaneously and the sinusoidal signal shown in FIG. 3 is calculated. Then the direction of the magnetic field generated by the magnetic ring 4 is determined based on the null transition 9. The amplitude of the output signal of the sensor arrangement 6 corresponds to the magnitude of the magnetic field in this case. The magnetic field of the magnetic ring 4 has a magnetic flux B, which can be represented at any position in the magnetic field by a vector. This vector has a tangential magnetic field direction $B_Y$, a radial magnetic field direction $B_X$ and a normal magnetic field direction $B_Z$. The tangential magnetic field direction $B_Y$ is aligned parallel to the x-y plane and runs parallel to an orientation of the poles of the magnetic ring 4. The radial magnetic field direction $B_X$ is formed parallel to the x-y plane and runs transversely to the orientation of the magnetic poles. The normal magnetic field direction $B_Z$, which will not be considered further, runs transversely to the tangential and radial magnetic field directions.

Figure 4:
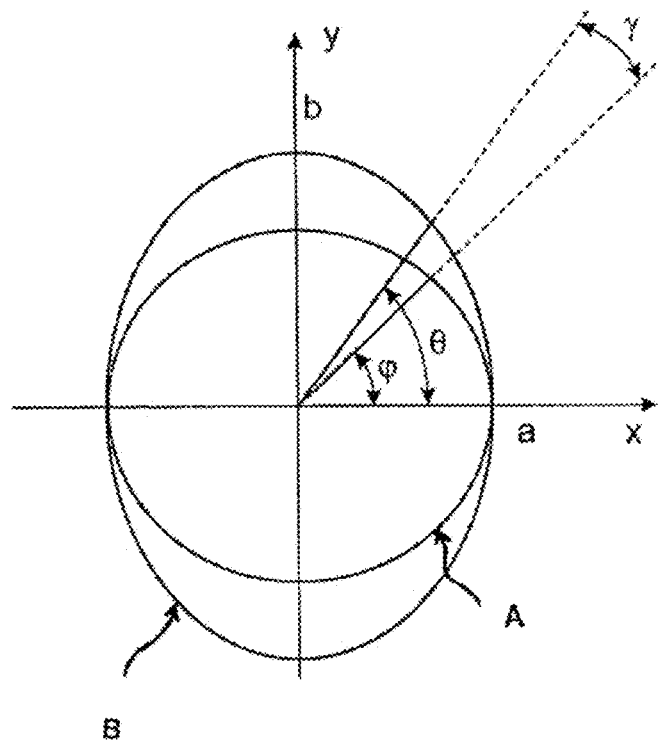
FIG. 4 shows a basic representation of the magnetic directions of a magnetic flux of the magnetic field caused by the magnetic ring on the basis of a Lissajous figure.

The tangential and radial magnetic field directions are shown using a Lissajous figure in FIG. 4. The circle A represents the radial magnetic field direction and the ellipse B represents the tangential magnetic field direction during a rotation of the magnetic ring 4. The circle A represents the desired ideal form. The circle A has a major axis a, while the ellipse B has a major axis b. In addition, in FIG. 4 the actual angular position θ obtained from the signal of the sensor arrangement 6 and an expected angle position φ are reproduced. The actual angular position θ obtained from the signal of the sensor arrangement 6 deviates from the expected angular position φ by the angular error γ.

Figure 5:
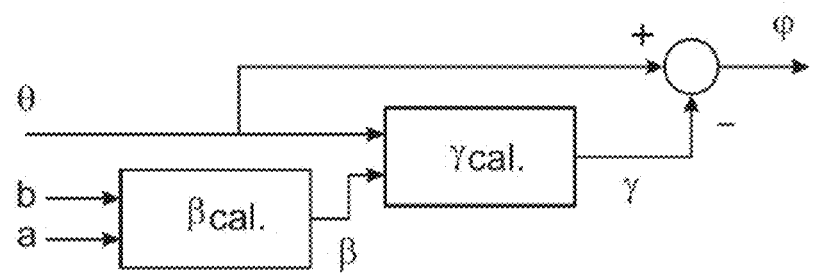
FIG. 5 shows an exemplary embodiment of the method.

An exemplary method is shown in FIG. 5. In block 100, a correction parameter β is determined taking into account the long major axis b of the ellipse B and the short major axis a of the ellipse A of the magnetic flux determined from the tangential and radial magnetic field directions.

$$\beta = b/a. \tag{1}$$

In block 200, the correction parameter β determined in this way is used to determine the angular error γ.

$$Y = \arctan\left[\frac{(\beta - 1)\tan(\theta)}{\beta + \tan^2(\theta)}\right] \tag{2}$$

From the actual measured angular position θ and the angular error γ, the actual angular position φ of the rotor 2 of the electric motor is then determined.

$$\gamma = \theta - \varphi \rightarrow \varphi = \theta - \gamma \tag{3}$$

Figure 6:
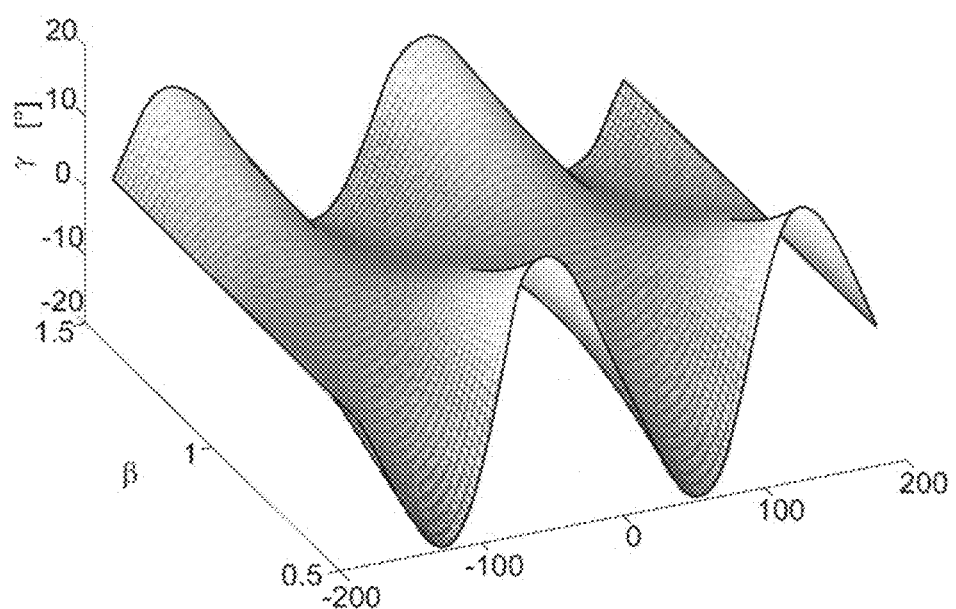
FIG. 6 shows a representation of the angular error as a function of the signal output by the sensor arrangement.

The change of the angular error γ as a function of the correction parameter β and the currently determined angular position φ are shown in FIG. 6.

The angular error γ is highly dependent on the correction factor β. For a static application, β is a constant. This constant is learned, for example, at the end of actuator production. For dynamic applications, however, β is variable since a tolerance range must be found.

While the angular positions are monitored at high frequency, the long and short major axes a, b are read out with a much slower sampling frequency. Monitoring twice per revolution of the electric motor is sufficient here. As a result, the correction parameter β is adjusted multiple times during a rotation.

The proposed solution allows reliable determination of the actual angular position of the rotor 2 of the electric motor using the elliptical nonlinearity correction method in which a circle is produced from the ellipse in a Lissajous figure representation.

REFERENCE CHARACTER LIST

1 Actuator
2 Rotor
3 Stator
4 Magnetic ring
5 Board
6 Sensor arrangement
7 Rotation axis 8 Hall sensor
9 Null transition
10 Point on sinusoidal output signal

The invention claimed is:

1. A method for determining an actual angular position of a rotating component for a clutch actuation system of a vehicle, in which a measured angular position of the rotating component is obtained from a sensor arrangement that is radially spaced apart from a rotation axis of the rotating component, wherein a magnetic ring that is fixed to and concentrically disposed on the rotating component builds up a magnetic field that changes with respect to the sensor arrangement and is detected by the sensor arrangement, wherein a signal obtained from the sensor arrangement is evaluated with respect to the measured angular position, wherein the signal obtained from the sensor arrangement is evaluated with respect to amplitude information of the magnetic field, wherein the amplitude information includes an amplitude of a tangential magnetic field direction, which is represented by a Lissajous ellipse, and an amplitude of a radial magnetic field direction, which is represented by a Lissajous circle, of a magnetic flux, wherein a correction parameter is determined from a ratio of a major axis of the Lissajous ellipse and a major axis of the Lissajous circle, wherein the correction parameter is determined after assembly of the sensor arrangement and is initialized prior to determining the actual angular position, wherein an angular error is determined from the correction parameter and the measured angular position, wherein the actual angular position is determined based on a difference between the measured angular position and the angular error.

2. The method as claimed in claim 1, wherein the correction parameter is used as a constant to correct static errors in determining the actual angular position.

3. The method as claimed in claim 1, wherein the correction parameter is adapted to correct dynamic errors in determining the actual angular position.

4. The method as claimed in claim 1, wherein evaluation electronics contained in the sensor arrangement are used for evaluation of the signal obtained from the sensor arrangement with respect to the amplitudes of the magnetic field and the measured angular position of the rotating component.

5. The method as claimed in claim 4, wherein the measured angular position of the rotating component output by the evaluation electronics is sampled at high frequency.

6. The method as claimed in claim 4, wherein the amplitude of the magnetic field output by the evaluation electronics is sampled at low frequency.

7. The method as claimed in claim 6, wherein the amplitude of the magnetic field is sampled at least twice per revolution of the rotating component.

8. A method for determining an actual angular position of an electric motor for a clutch actuation system of a vehicle, the method comprising:
providing a sensor arrangement radially spaced apart from a rotation axis of a rotating component;
obtaining a signal from the sensor arrangement;
evaluating the signal obtained from the sensor arrangement with respect to a measured angular position of the rotating component;
evaluating the signal obtained from the sensor arrangement with respect to amplitude information of a magnetic field generated by an interaction between the rotating component and a magnet, wherein the amplitude information includes an amplitude of a tangential magnetic field direction, which is represented by a Lissajous ellipse, and an amplitude of a radial magnetic field direction, which is represented by a Lissajous circle, of a magnetic flux;
determining a correction parameter based on a major axis of the Lissajous ellipse and a major axis of the Lissajous circle, wherein the correction parameter is determined after assembly of the sensor arrangement and is used as an initial correction parameter of a measurement process;
determining an angular error based on the correction parameter and the measured angular position; and
determining the actual angular position based on a difference between the measured angular position and the angular error.

9. The method of claim 8, wherein the correction parameter is used as a constant during the measurement process a constant.

10. The method of claim 8, wherein the correction parameter is adapted during the measurement process.

11. The method of claim 8, wherein the amplitude information is sampled at least twice per revolution of the rotating component.

* * * * *